(12) United States Patent
Liu

(10) Patent No.: US 7,028,433 B2
(45) Date of Patent: Apr. 18, 2006

(54) ASEISMATIC DEVICE

(75) Inventor: Kuo-Tai Liu, Hsin-Chu Hsien (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 70 days.

(21) Appl. No.: 10/708,944

(22) Filed: Apr. 2, 2004

(65) Prior Publication Data

US 2005/0126423 A1    Jun. 16, 2005

(30) Foreign Application Priority Data

Dec. 11, 2003 (TW) .............................. 92135017 A

(51) Int. Cl.
*E01B 1/346* (2006.01)
(52) U.S. Cl. ................... 52/167.3; 52/167.4; 52/66; 104/89
(58) Field of Classification Search ............ 52/167.1, 52/167.2, 167.3, 167.5, 167.6, 167.8, 66, 52/167.4; 105/163.1, 163.2; 104/89, 93, 104/88.01; 248/562

See application file for complete search history.

(56) References Cited

U.S. PATENT DOCUMENTS

| 4,382,413 | A | * | 5/1983 | Kakehi et al. ............ 105/163.1 |
| 4,496,130 | A | * | 1/1985 | Toyama ...................... 248/585 |
| 4,974,378 | A | * | 12/1990 | Shustov ...................... 52/167.5 |
| 5,452,549 | A | * | 9/1995 | Medeot et al. ............. 52/167.8 |
| 2003/0167707 | A1 | * | 9/2003 | Tsai ........................... 52/167.5 |
| 2003/0205004 | A1 | * | 11/2003 | Shreiner ........................ 52/66 |

FOREIGN PATENT DOCUMENTS

| JP | 6234495 A | * | 6/1994 |
| JP | 06234495 A | * | 8/1994 |

* cited by examiner

*Primary Examiner*—Frantz F. Jules
(74) *Attorney, Agent, or Firm*—Winston Hsu

(57) ABSTRACT

An aseismatic device applied to an overhead hoist transport (OHT) system in a fab has a spring pin and a positioning ball installed in a cavity of a first platform. The spring pin has at least a spring for fixing the positioning ball and is mounted on a second platform positioned on the surface of the first platform. When the earthquake occurs, the second platform will move horizontally corresponding to the first platform for preventing the OHT system and the fab from being damaged.

16 Claims, 6 Drawing Sheets

ASEISMATIC DEVICE

BACKGROUND OF INVENTION

1. Field of the Invention

The present invention relates to an aseismatic device, and more particularly, to an aseismatic device having a spring pin and a positioning ball able to absorb the seismic energy.

2. Description of the Prior Art

As semiconductor technology improves and the requirements of electronic products increase, the semiconductor manufacturers annually invest more and more capital to purchase new equipment and to construct new factories. Take a fab, an upstream manufacturer in the semiconductor industries, as an example. Many wafer manufacturers have launched a mass production of 12-inch wafers in a critical dimension of 0.13 μm or less than 0.13 μm. For these wafer manufactures, although the unit cost is effectively reduced due to the large area of 12-inch wafers, the cost of 12-inch wafers is relatively higher in comparison with 8-inch wafers. Consequently, once the 12-inch wafers are damaged in the course of transporting due to human ignorance or unexpected disaster (e.g. earthquake), the loss is higher.

Since the semiconductor technology improves, more manufacturing processes are required than ever. Normally, the semiconductor components require hundreds of different processes to be accomplished, thus, it requires a huge capacity for a fab to load necessary equipment. In addition, it also requires sufficient space and proper transport system for delivering the wafers in process or the completed wafer products. Therefore, a large amount of fabs adopt an overhead hoist transport (OHT) system for delivering the wafers. Since the OHT system delivers the wafers with a track suspended from the ceiling, the space usage is more efficient.

Please refer to FIG. 1. FIG. 1 is a schematic diagram of a conventional OHT system 20 installed in a fab 10. As shown in FIG. 1, considering the construction cost, the fab 10 normally includes an administrative building 12 and a factory building 14 having clean rooms (not shown) in it. The administrative building 12 and the factory building 14 are connected by an elevated walkway 16. The OHT system is suspended from the ceiling (not shown) of the administrative building 12 and the factory building 14 so that the wafers are delivered among different clean rooms (not shown) or between the administrative building 12 and the factory building 14.

Please refer to FIG. 2. FIG. 2 is a schematic diagram of the conventional OHT system 20 shown in FIG. 1. As shown in FIG. 2, the OHT system 20 includes a track 22 suspended from the ceiling (not shown) by a plurality of supporting rods 24. The track 22 allows at least a wafer trolley 26 to travel along so that the wafers (not shown) are delivered among different clean rooms (not shown).

The conventional OHT system 20 is able to deliver the wafers without requiring too much space. However, once an earthquake occurs, the wafers tend to be damaged. The reason is that the ceiling (not shown) bears the OHT system 20 and the wafers (not shown). This extra burden has not been taken into consideration while the administrative building 12 or the factory building 14 was constructed. As a result, the wafers (not shown), the OHT system 20, or even the fab (shown in FIG. 1) are easily damaged.

Therefore, an OHT system having aseismatic ability is eagerly required for preventing damage during an earthquake.

SUMMARY OF INVENTION

It is therefore a primary objective of the present invention to provide an aseismatic device for solving the above-mentioned problems.

According to the claimed invention, an aseismatic device is disclosed. The aseismatic device includes a spring pin and a positioning ball, wherein the spring pin has at least a spring. The positioning ball is fixed in a cavity located on the surface of a platform by the elastic force of the spring. The spring pin decides a horizontal aseismatic value by adjusting quantities of the spring. As long as a horizontal force that acts on the aseismatic device is greater than the horizontal aseismatic value, the positioning ball shifts away from the cavity for cushioning the horizontal force. The aseismatic device can be applied to an overhead hoist transport (OHT) system. The OHT system includes at least one hoist truss suspended from the ceiling of a building, a first platform suspended from the hoist truss by a plurality of first supporting rods, a second platform positioned on the surface of the first platform and supported by the first platform, and a track for at least a wafer trolley to travel along. It is worth noting that if the aseismatic device is applied to the OHT system, the platform that the positioning ball is located on is the second platform of the OHT system.

Since the aseismatic device of the present invention is capable of absorbing the seismic energy, the wafers will be prevented from being damaged when earthquake occurs.

These and other objects of the present invention will be apparent to those of ordinary skill in the art after having read the following detailed description of the preferred embodiment that is illustrated in the various figures and drawings.

DETAILED DESCRIPTION

As mentioned earlier, the fab requires sufficient space for accommodating all the necessary equipment and the transport system. Considering the construction cost and the structure safety, more and more fabs construct two or more independent buildings instead of one single factory building. The two buildings are connected with an elevated walkway, and the OHT system is suspended from the ceiling of both buildings. Either a single huge factory or two buildings are constructed; the aseismatic ability is the minimum requirement. Since the conventional OHT system lacks the aseismatic ability, once earthquake occurs the wafers or even the fab will be seriously damaged.

Figure 1:
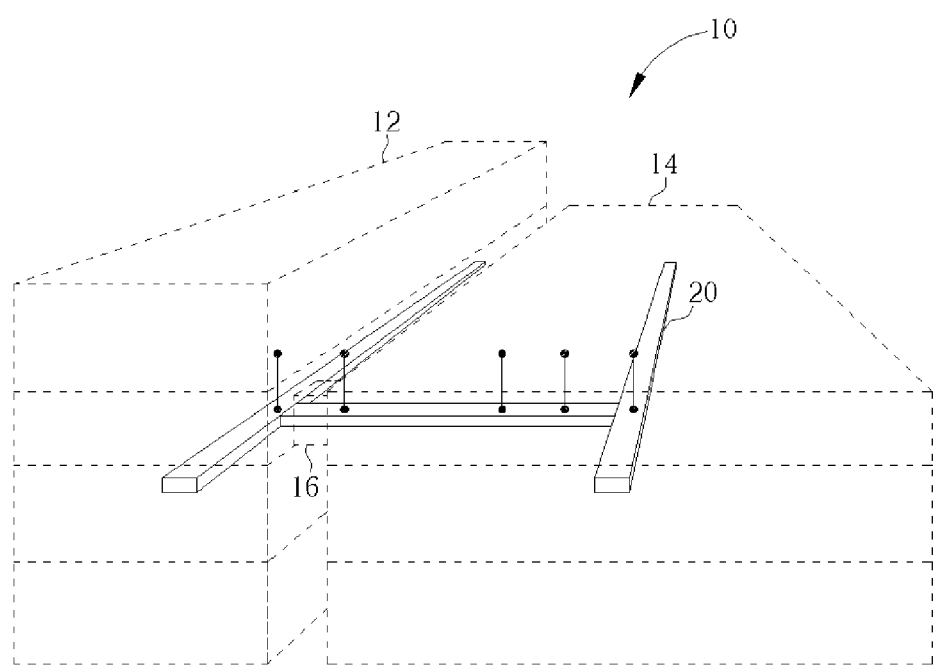
FIG. 1 is a schematic diagram of a conventional OHT system installed in a fab.
Figure 2:
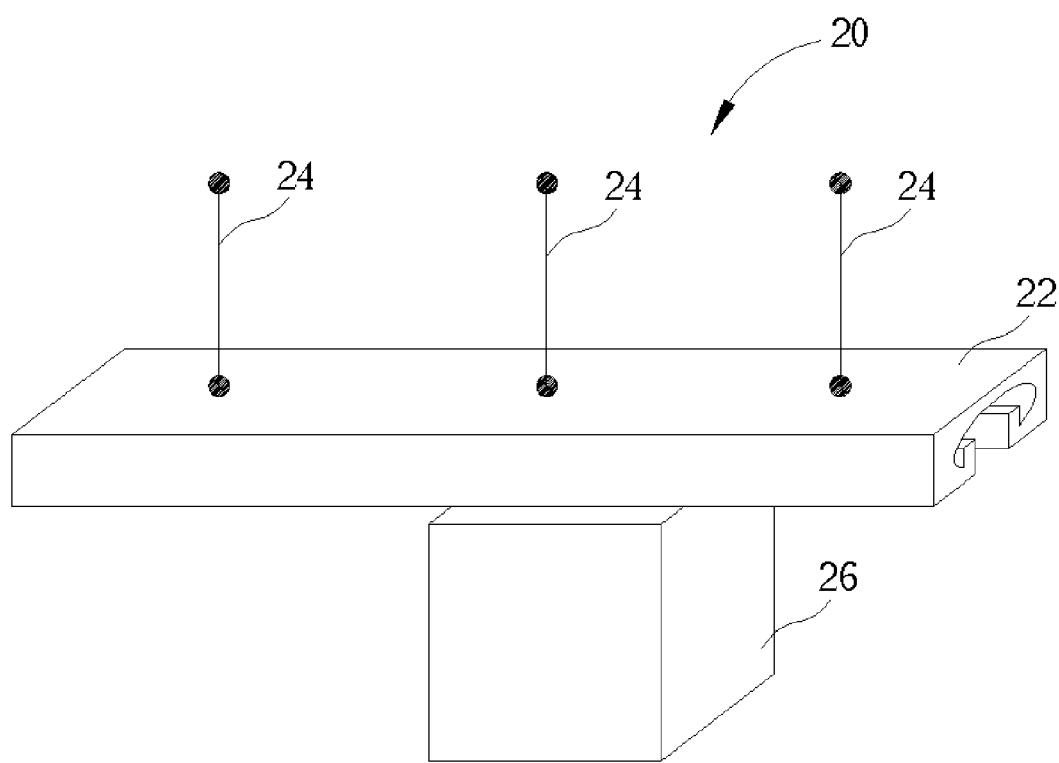
FIG. 2 is a schematic diagram of the conventional OHT system shown in FIG. 1.
Figure 3:
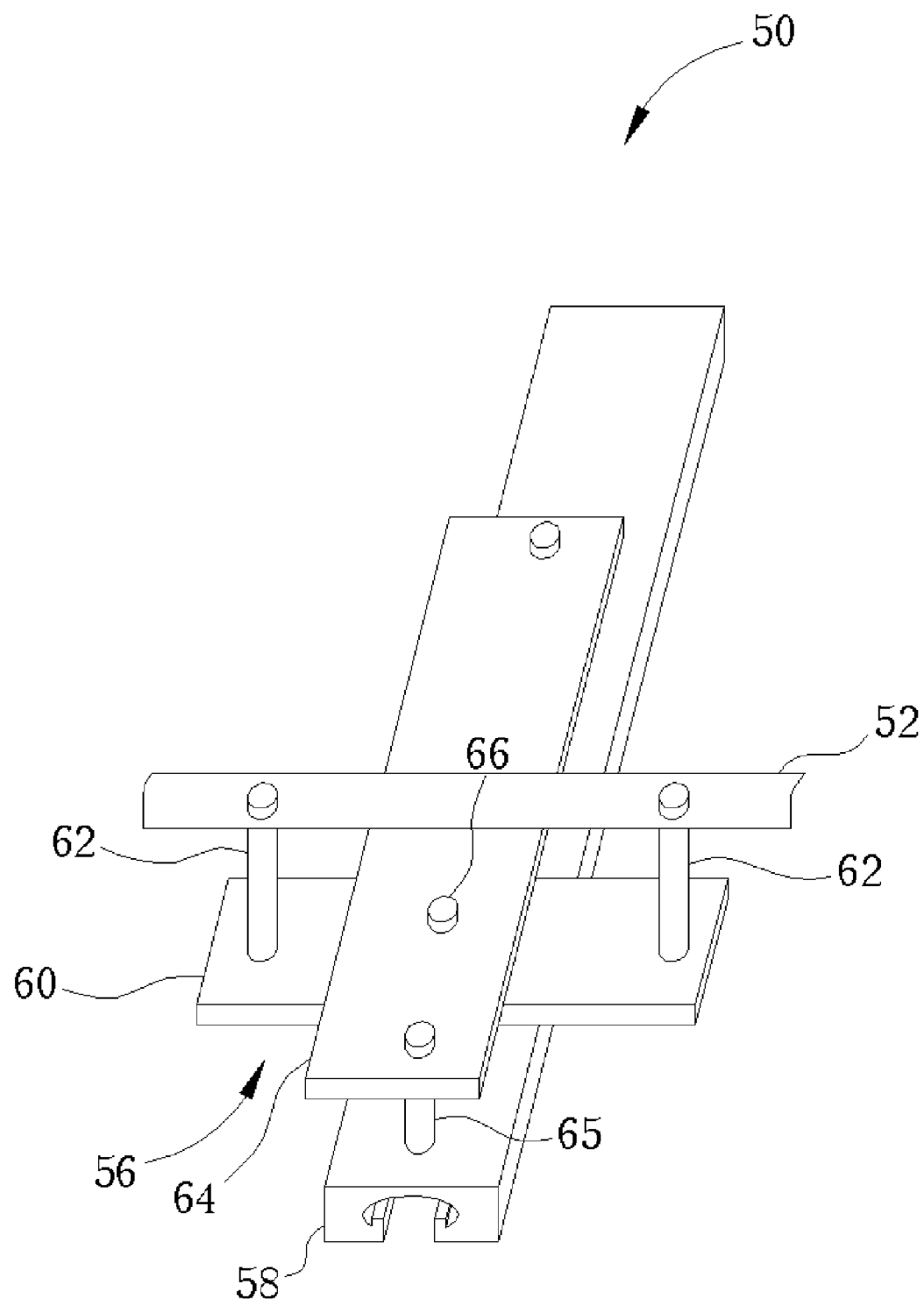
FIG. 3 is a schematic diagram of an aseismatic device of the present invention applied to an OHT system.

Please refer to FIG. 3. FIG. 3 is a schematic diagram of an aseismatic device 56 of the present invention that is applied to an OHT system 50. As shown in FIG. 3, the OHT system 50 includes at least one hoist truss 52 suspended from the ceiling (not shown), a first platform 60 fixed under the hoist truss 52 and supported by a plurality of first supporting rods 62, a second platform 64 positioned on the surface of the first platform 60 and supported by the first platform 60, and a track 58, which allows at least a wafer trolley (not shown) to travel along, supported by a plurality of second supporting rods 65. The aseismatic device 56 of the present invention is installed under the hoist truss 52, and includes at least a spring pin 66 positioned in the second platform 64 and passing through the second platform 64. In this embodiment of the present invention, the first platform 60 and the second platform 64 are two rectangular structures arranged perpendicularly.

Figure 4:
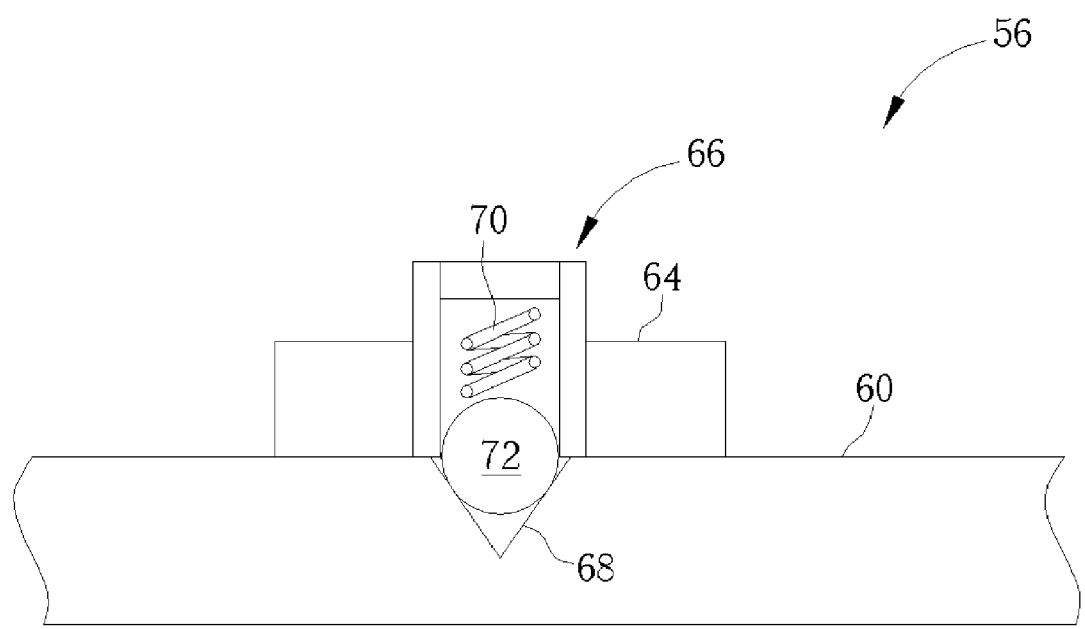
FIG. 4 is a schematic diagram of the aseismatic device shown in FIG. 3.

For better explaining the mechanism of the aseismatic device 56 of the present invention, please refer to FIG. 4. FIG. 4 is a schematic diagram of the aseismatic device 56 of the present invention. As shown in FIG. 4, the aseismatic device 56 further includes a positioning ball 72 positioned in a cone-shaped cavity 68 of the first platform 60. In addition, the spring pin 66, which has at least a spring 70 therein, passes through the second platform 64 and positioned on the top of the cavity 68. In normal conditions, the positioning ball 72 is fixed in the cavity 68 by the elastic force of the spring 70 so that the first platform 60 and the second platform 64 are not moved relatively. While the earthquake occurs, the positioning ball 72 is horizontally shifted away from the cavity 68 so that the seismic energy is absorbed. Consequently, the OHT system 50 and the clean rooms (not shown) will not be damaged by the seismic energy.

In addition, the aseismatic device 56 can decide a horizontal aseismatic value by adjusting quantities of the spring 70, the position and quantities of the spring pin 66, or the tilt angle of the inner walls of the cavity 68 for optimizing the aseismatic ability. For example, if the OHT system 50 cannot bear a force more than 40 kg, then the horizontal aseismatic value can be set to 40 kg by the above-mentioned methods. In such case, if the horizontal force during an earthquake does not reach 40 kg, the aseismatic device 56 will not function.

Figure 5:
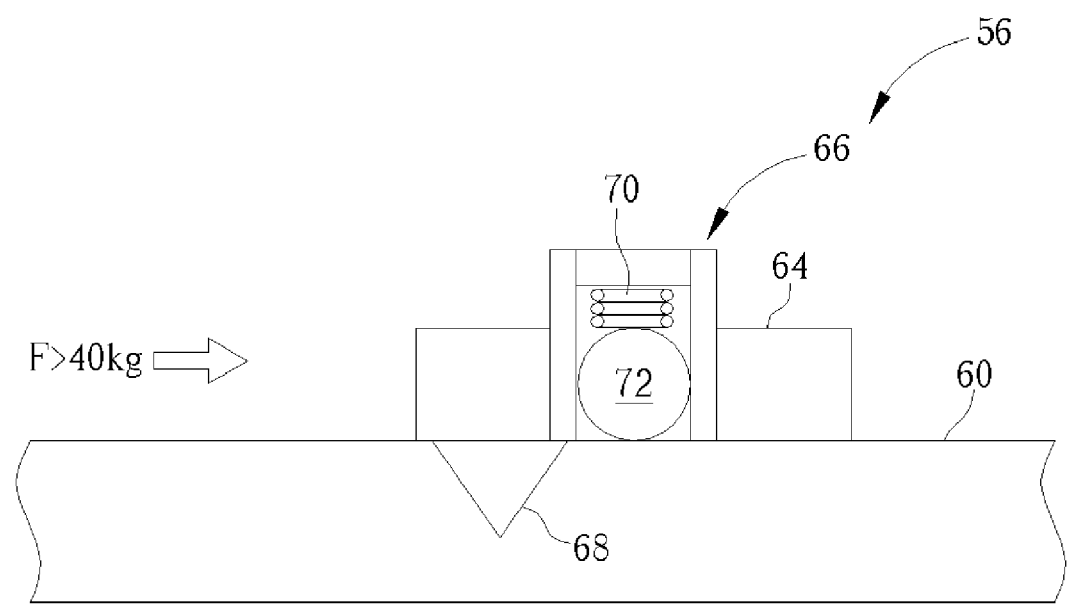
FIG. 5 is a schematic diagram illustrating a condition when a horizontal force larger than a horizontal aseismatic value acts on the aseismatic device.

On the other hand, as long as the horizontal force exceeds 40 kg, the positioning ball 72 will shift away from the cavity 68. This leads to a relative movement between the first platform 60 and the second platform 64 and prevents the OHT system 50 from being damaged. Please refer to FIG. 5. FIG. 5 is a schematic diagram illustrating a condition when a horizontal force larger than a horizontal aseismatic value acts on the aseismatic device 50. As shown in FIG. 5, while a force from any horizontal directions is greater than the horizontal aseismatic value (40 kg), the positioning ball 72 will shift away along the inner wall of the cavity 68 because the elastic force of the spring 70 fails to hold the positioning ball 72. In such case, the second platform 64 will move relatively and absorb the seismic energy so that the OHT system 50 and the clean rooms (not shown) are not damaged.

Figure 6:
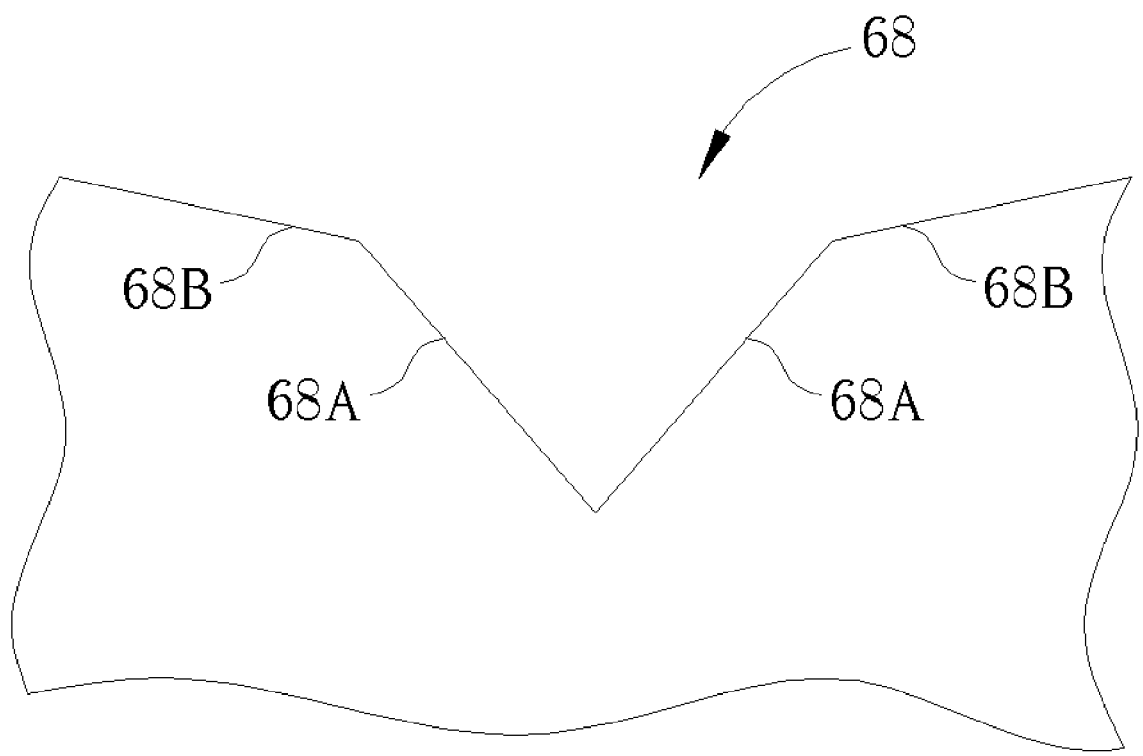
FIG. 6 is a schematic diagram of a cavity in another embodiment of the present invention.

If the OHT system 50 is not damaged during the earthquake, the positioning ball 72 can be recovered to the cavity 68 by an external force for retaining the aseismatic ability of the aseismatic device 56. For a worse condition, if the OHT system 50 is damaged due to an intense seismic energy, the aseismatic device 56 will reduce the damage to the minimum. In addition, the horizontal aseismatic value can also be adjusted by altering the shape of the cavity 68. For example, the inner walls can be adjusted to have two tilt angles for improving the aseismatic ability. Please refer to FIG. 6. FIG. 6 is a schematic diagram of the cavity 68 in another embodiment of the present invention. As shown in FIG. 6, the cavity 68 includes a first plane 68A and a second plane 68B having different tilt angles. When the earthquake occurs, the positioning ball 72 may shift away from the first plane 68A and stay on the second plane 68B in certain conditions. In such case, while the earthquake ends the positioning ball 72 will slide back to the bottom of the cavity 68 without requiring an external force due to gravity and the elastic force of the spring 70. FIG. 6 only shows a modification of the cavity 68, the cavity 68 can be modified to a different structure, such as a circular shape or a zigzag shape, according to a testing result or practical requirement. Furthermore, the shape of the first platform 60 and the second platform 64 is modifiable.

The above-mentioned embodiment is a preferred embodiment of the present invention. However, the application of the aseismatic device 56 is not limited to the OHT system 50. The aseismatic device 56 of the present invention can be applied to any suspended equipments for providing aseismatic ability.

In comparison with the prior art, the aseismatic device 56 is able to absorb the seismic energy. Therefore, the aseismatic device 56 can be installed in any positions of the OHT system 50 for optimizing the aseismatic ability.

Those skilled in the art will readily appreciate that numerous modifications and alterations of the device may be made without departing from the scope of the present invention. Accordingly, the above disclosure should be construed as limited only by the metes and bounds of the appended claims.

What is claimed is:

1. An aseismatic device applied to an overhead hoist transport (OHT) system for enhancing an aseismatic ability, the OHT system comprising a first platform and a second platform in contact with and being supported by the first platform, the first platform comprising a plurality of second supporting rods for suspending and supporting a heavy object, the aseismatic device comprising:
   a spring pin having at least a spring therein; and
   a positioning ball fixed in a cavity of the first platform by an elastic force of the spring;
   wherein the spring pin decides a horizontal aseismatic value by adjusting quantities of the spring, and as long as a horizontal force that acts on the aseismatic device is greater than the horizontal aseismatic value, the positioning ball shifts away from the cavity for cushioning the horizontal force.

2. The aseismatic device of claim 1 wherein the spring pin is fixed in a position of the second platform corresponding to the cavity of the first platform, and the spring pin passes through the second platform.

3. The aseismatic device of claim 1 wherein the first platform is firmly suspended from at least one hoist truss by a plurality of first supporting rods.

4. The aseismatic device of claim 3 wherein the hoist truss is fixed in a ceiling of a building.

5. The aseismatic device of claim 1 wherein the heavy object is a track of a wafer trolley that delivers wafers.

6. The aseismatic device of claim 1 wherein the first platform is a rectangular structure having a longer side facing a first direction.

7. The aseismatic device of claim 6 wherein the second platform is a rectangular structure having a longer side facing a second direction perpendicular to the first direction.

8. The aseismatic device of claim 1 wherein the cavity is a cone-shaped cavity.

9. The aseismatic device of claim 8 wherein walls of the cavity comprise a first tilt angle and a second tilt angle.

10. The aseismatic device of claim 1 wherein when the second platform is shifted horizontally by the horizontal force, the second platform is capable of being recovered shortly thereafter by an external force for retaining the aseismatic ability.

11. An aseismatic overhead hoist transport (OHT) system comprising:
- at least one hoist truss fixed in a ceiling of a building;
- a first platform suspended from the hoist truss by a plurality of first supporting rods, the first platform having a cavity on a top surface;
- a second platform positioned on the first platform and supported by the first platform, wherein the first platform and the second platform are in contact with each other;
- at least an aseismatic device positioned under the hoist truss, the aseismatic device comprising:
  - at least a spring pin fixed in a position of the second platform corresponding to the cavity of the first platform, the spring pin passing through the second platform;
  - a positioning ball fixed in the cavity by an elastic force of the spring so that the first platform and the second platform remain relatively stationary; and
- a track of a wafer trolley suspended from the first platform by a plurality of second supporting rods;

wherein the spring pin decides a horizontal aseismatic value by adjusting quantities of the spring, and as long as a horizontal force that acts on the aseismatic OHT system is greater than the horizontal aseismatic value, the positioning ball shifts away from the cavity for preventing the aseismatic system from being damaged.

12. The aseismatic OHT system of claim 11 wherein the first platform is a rectangular structure having a longer side facing a first direction.

13. The aseismatic OHT system of claim 12 wherein the second platform is a rectangular structure having a longer side facing a second direction perpendicular to the first direction.

14. The aseismatic OHT system of claim 11 wherein the cavity is a cone-shaped cavity.

15. The aseismatic OHT system of claim 14 wherein walls of the cavity comprise a first tilt angle and a second tilt angle.

16. The aseismatic OHT system of claim 11 wherein when the second platform is shifted horizontally by the horizontal force, the second platform is capable of being recovered shortly thereafter by an external force for retaining an aseismatic ability.

* * * * *